(12) United States Patent
Ikeda

(10) Patent No.: US 7,079,071 B2
(45) Date of Patent: Jul. 18, 2006

(54) RADAR APPARATUS

(75) Inventor: Hiroshi Ikeda, Tokyo (JP)

(73) Assignee: TDK Corporation, Tokyo (JP)

( * ) Notice: Subject to any disclaimer, the term of this patent is extended or adjusted under 35 U.S.C. 154(b) by 65 days.

(21) Appl. No.: 11/010,342

(22) Filed: Dec. 14, 2004

(65) Prior Publication Data

US 2005/0140542 A1 Jun. 30, 2005

(30) Foreign Application Priority Data

Dec. 17, 2003 (JP) ............................. 2003-419235

(51) Int. Cl.
G01S 13/08 (2006.01)

(52) U.S. Cl. .................. 342/70; 342/128; 342/129; 342/130; 342/132

(58) Field of Classification Search ............ 342/70–72, 342/127–137, 175, 195, 200–204
See application file for complete search history.

(56) References Cited

U.S. PATENT DOCUMENTS

| 3,408,938 | A | * | 11/1968 | Pagazani et al. | ............. | 102/214 |
| 4,227,195 | A | * | 10/1980 | Salerno et al. | ............. | 342/189 |
| 2005/0134498 | A1 | * | 6/2005 | Honya et al. | ................. | 342/70 |
| 2005/0140542 | A1 | * | 6/2005 | Ikeda | ......................... | 342/118 |
| 2006/0039449 | A1 | * | 2/2006 | Fontana et al. | ............. | 375/130 |

FOREIGN PATENT DOCUMENTS

| EP | 1545001 A2 | * | 6/2005 |
| JP | 6-303114 | | 10/1994 |
| JP | 2005180992 A | * | 7/2005 |

OTHER PUBLICATIONS

English Language Abstract of JP 6-303114.

* cited by examiner

Primary Examiner—John B. Sotomayor
(74) Attorney, Agent, or Firm—Greenblum & Bernstein, P.L.C.

(57) ABSTRACT

A radar apparatus includes: a modulation signal generating circuit that generates a modulation signal; a carrier wave generating circuit that generates a carrier wave; a modulation circuit that outputs a high frequency signal generated by modulating the carrier wave using the modulation signal that has been inputted; a modulation signal extracting circuit that extracts the modulation signal from the high frequency signal that has been inputted; and a detection signal generating circuit that generates a detection signal, which can be used to measure a distance to a measured object, based on the modulation signal extracted by the modulation signal extracting circuit from a component, out of the high frequency signal that has been transmitted via a transmission antenna, the component having been reflected by the measured object and received by a reception antenna. The modulation signal generating circuit includes a sine wave signal generating circuit that generates a sine wave signal and a pulse signal generating circuit that generates a modulation signal by converting the generated sine wave signal to a pulse signal using a step recovery diode.

6 Claims, 3 Drawing Sheets

F I G. 1
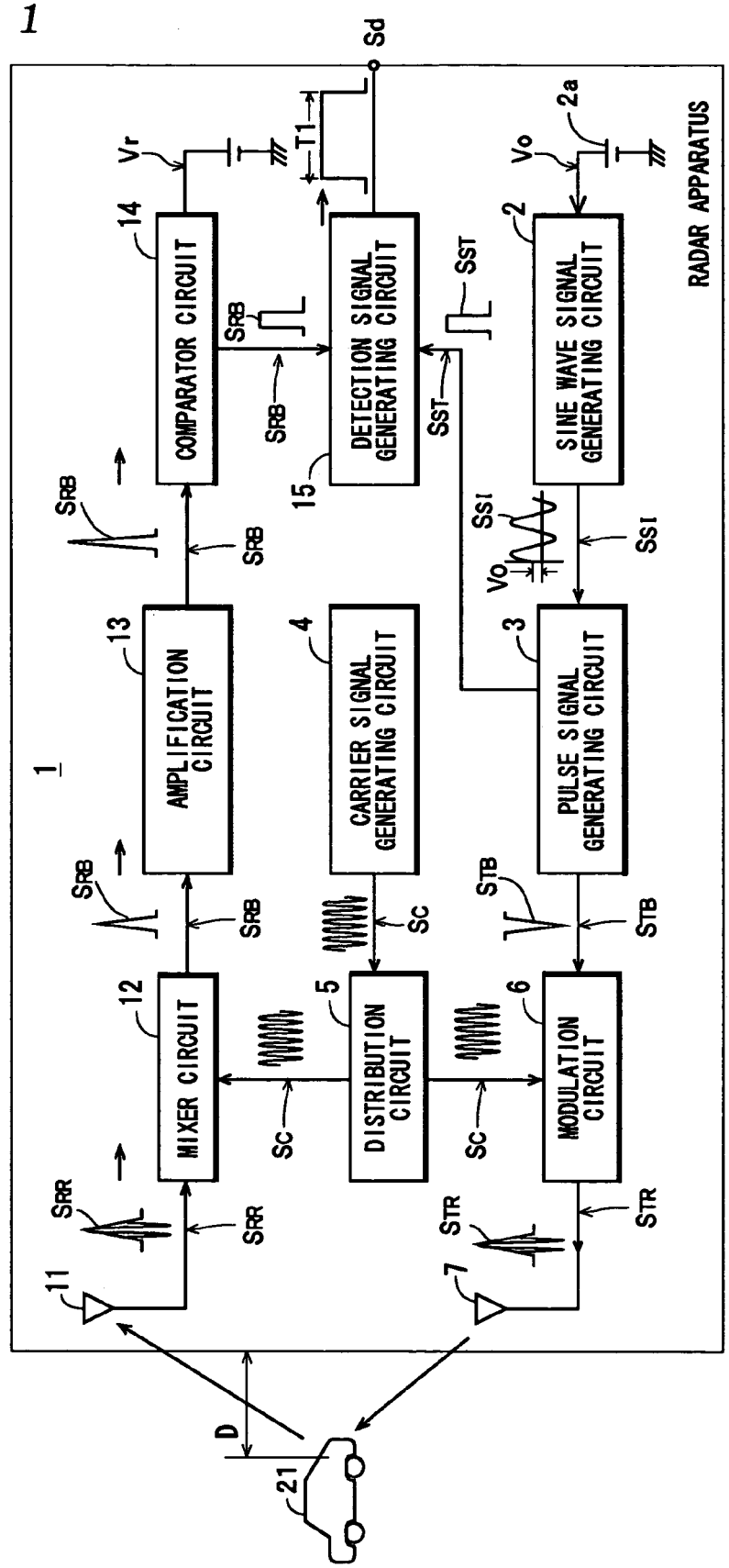

RADAR APPARATUS

BACKGROUND OF THE INVENTION

1. Field of the Invention

The present invention relates to a radar apparatus that is installed inside a vehicle or the like, for example, and is constructed so as to be capable of detecting a distance to a measured object such as an obstacle located in front of the vehicle or the like.

2. Description of the Related Art

When a radar apparatus of this type detects distance to an obstacle such as a vehicle, first a high frequency signal, which has been modulated with a pulse signal as a modulation signal, is outputted from a transmission antenna. The high frequency signal is reflected by the vehicle or other obstacle and is received by a reception antenna. Here, the time taken from the transmission of the high frequency signal to the reception of the high frequency signal is the time taken by the high frequency signal to go back and forth on the distance between the radar apparatus and the obstacle, that is, the time required to cover a distance (2×D) that is double a distance D. However, when detecting an obstacle at a comparatively short distance using a modulation signal with a wide pulse width, before the transmission of the high frequency signal from the transmission antenna has been completed, the high frequency signal reflected by the obstacle starts to be inputted by a reception antenna. This means that for this type of radar apparatus where a reception device does not operate during the transmission of a high frequency signal, a rising edge (or trailing edge) of a front end part of the high frequency signal reflected by the obstacle cannot be detected, so that the distance to the obstacle cannot be detected. Accordingly, to detect the distance to an obstacle at a relatively short distance, it is necessary to reduce the pulse width of the modulation signal sufficiently for the transmission to be completed before the reflected waves from the obstacle arrive at the reception antenna. That is, a pulse signal generating circuit that can generate a modulation signal with a narrow pulse width is required.

A pulse generating circuit disclosed by Japanese Laid-Open Patent Publication No. H06-303114 is one example of a pulse signal generating circuit used in this kind of radar apparatus. As shown in FIG. 1 of this publication, this pulse signal generating circuit includes an inverter provided at a signal input stage, two delay circuits, a NAND circuit that receives an input of a signal from both delay circuits, and a NOR circuit. In this case, one of the delay circuits is constructed of a two-stage inverter and delays an input signal whose polarity has been inverted by an inverter provided at the signal input stage. The other delay circuit is constructed of a three-stage inverter and delays a control signal for controlling an outputting or stopping of output of the pulse signal.

As shown in FIG. 2 of the same publication, with this pulse signal generating circuit, when the input signal of the inverter rises, one of the inputs of the NOR circuit falls to become low. Accordingly, the output of the NOR circuit becomes high. In a state where the control signal is high, when the output of one of the delay circuits has become low after being delayed in accordance with a delay period of the delay circuit, the output of the NAND circuit becomes high after being delayed relative to the input signal by a period in accordance with the delay period and is inputted into the other input of the NOR circuit. When the output of the NAND circuit changes to high, the output of the NOR circuit falls to become low. Accordingly, the NOR circuit maintains a high output for the delay period of a subsystem composed of one of the delay circuits and the NAND circuit. As a result, an output signal with a pulse width equal to the delay period is generated. In this way, it is possible to obtain a pulse signal with a narrow pulse width using this pulse signal generating circuit.

By investigating the pulse signal generating circuit described above, the present inventor discovered the following problems. That is, when the pulse signal generating circuit described above is constructed using a low-cost CMOS logic circuit, the frequency characteristics, delay period, through rate and the like are limited so that it is difficult to generate an output signal with a pulse width of several nanoseconds or less. This means that it is difficult to reduce the minimum detection distance of the radar apparatus. On the other hand, when the pulse signal generating circuit is constructed using an expensive high-speed logic circuit constructed using a compound semiconductor or the like to generate an output signal with a narrow pulse width, there is the problem that the cost of the pulse signal generating circuit, and in turn the cost of the radar apparatus, rise considerably. In addition, when the pulse signal generating circuit is constructed using a combination of logic circuits, there is the problem that the size of the pulse signal generating circuit, and in turn the size of the radar apparatus, become large.

SUMMARY OF THE INVENTION

The present invention was conceived in view of the problem described above, and it is a principal object of the present invention to provide a radar apparatus that is small, low-cost, and can reduce the minimum detection distance.

A radar apparatus according to the present invention includes: a modulation signal generating circuit that generates a modulation signal; a carrier wave generating circuit that generates a carrier wave; a modulation circuit that outputs a high frequency signal generated by modulating the carrier wave using the modulation signal that has been inputted; a modulation signal extracting circuit that extracts the modulation signal from the high frequency signal that has been inputted; and a detection signal generating circuit that generates a detection signal, which can be used to measure a distance to a measured object, based on the modulation signal extracted by the modulation signal extracting circuit from a component out of the high frequency signal that has been transmitted via a transmission antenna, the component having been reflected by the measured object and received by a reception antenna, wherein the modulation signal generating circuit includes a sine wave signal generating circuit that generates a sine wave signal and a pulse signal generating circuit that generates a modulation signal by converting the generated sine wave signal to a pulse signal using a step recovery diode.

With the radar apparatus described above, by constructing the modulation signal generating circuit from the sine wave signal generating circuit and the pulse signal generating circuit that generates the modulation signal by converting the sine wave signal to a pulse signal using a step recovery diode, the step recovery diode that switches from the ON state to the OFF state in an extremely short time can convert the sine wave signal to a modulation signal with an extremely narrow pulse width. In addition, by constructing the modulation signal generating circuit from the sine wave signal generating circuit and a step recovery diode, it is possible to construct a small, low-cost modulation signal generating circuit. Accordingly, with the radar apparatus described above, a small, low-cost radar apparatus with a short minimum detection distance can be realized.

The detection signal generating circuit may be constructed so as to generate the detection signal based on a transmission start signal, which is synchronized with one part of the modulation signal, and the same one part of the modulation signal that has been extracted by the modulation signal extracting circuit from the component of the high frequency signal that has been transmitted via the transmission antenna, the component having been reflected by the measured object and received by the reception antenna. Alternatively, the detection signal generating circuit may be constructed so as to generate the detection signal based on one part of the modulation signal that has been extracted by the modulation signal extracting circuit from the high frequency signal that has leaked into the reception antenna from the transmission antenna, and the same one part of the modulation signal that has been extracted by the modulation signal extracting circuit from the component of the high frequency signal that has been transmitted via the transmission antenna, the component having been reflected by the measured object and received by the reception antenna.

In addition, the sine wave signal generating circuit may add a direct current component to the sine wave signal. With this construction, the amplitude of the modulation signal can be increased compared to a construction that does not add a direct current component. Accordingly, a modulation signal with a narrow pulse width can be generated efficiently.

It should be noted that the disclosure of the present invention relates to a content of Japanese Patent Application 2003-419235 that was filed on 17, Dec. 2003 and the entire content of which is herein incorporated by reference.

BRIEF DESCRIPTION OF THE DRAWINGS

These and other objects and features of the present invention will be explained in more detail below with reference to the attached drawings, wherein:

FIG. 1 is a block diagram showing a construction of a radar apparatus according to the present invention;

DESCRIPTION OF THE PREFERRED EMBODIMENTS

Figure 2:
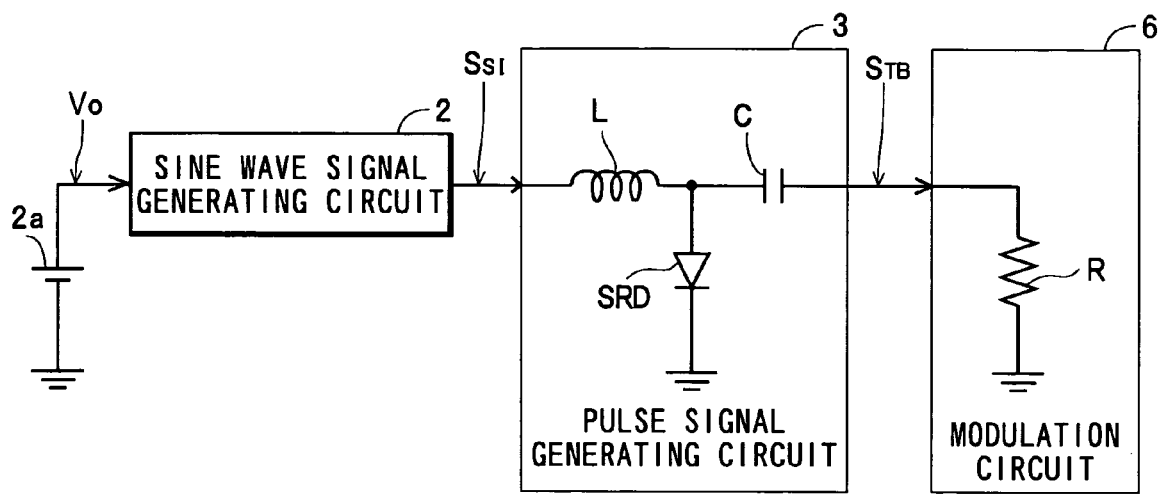
FIG. 2 is a block diagram that principally shows a circuit diagram of a pulse signal generating circuit and an equivalent input resistance of a modulation circuit.

Preferred embodiments of a radar apparatus according to the present invention will now be described with reference to the attached drawings.

As shown in FIG. 1, a radar apparatus 1 includes a sine wave signal generating circuit 2, a direct current power supply 2a, a pulse signal generating circuit 3, a carrier signal generating circuit 4, a distribution circuit 5, a modulation circuit 6, a transmission antenna 7, a reception antenna 11, a mixer circuit (a "modulation signal extracting circuit" for the present invention) 12, an amplification circuit 13, a comparator circuit 14, and a detection signal generating circuit 15, and is constructed so as to be capable of generating a detection signal $S_d$ that makes it possible to measure the distance D to a vehicle 21, for example, as a measured object. It should be noted that the sine wave signal generating circuit 2 and the pulse signal generating circuit 3 compose a "modulation signal generating circuit" for the present invention. As one example, the radar apparatus 1 is integrated (converted into a module) by resin molding in a state where the respective component elements described above have been mounted on a single printed circuit board.

The sine wave signal generating circuit 2 generates a sine wave signal $S_{SI}$ on which a baseband signal $S_{TB}$, described later, is based. The direct current power supply 2a outputs a positive direct current voltage $V_o$ (one example of a "direct current component" for the present invention) to the sine wave signal generating circuit 2. In this case, as shown in FIG. 1, the sine wave signal generating circuit 2 generates the sine wave signal $S_{SI}$ that is offset by the direct current voltage $V_o$. That is, the sine wave signal generating circuit 2 generates the sine wave signal $S_{SI}$ where a sine wave signal has been superposed on (added to) the direct current voltage $V_o$.

As shown in FIG. 2, the pulse signal generating circuit 3 includes a coil L, step recovery diode SRD, and a capacitor C, generates the baseband signal $S_{TB}$ (a "modulation signal" for the present invention) with a narrow pulse width from the sine wave signal $S_{SI}$ outputted by the sine wave signal generating circuit 2, and outputs the baseband signal $S_{TB}$ to the modulation circuit 6. More specifically, as shown in FIG. 2, in the pulse signal generating circuit 3, one end of the coil L is connected to an output part of the sine wave signal generating circuit 2 and the other end is connected to an anode of the step recovery diode SRD. The cathode of the step recovery diode SRD is connected to ground potential. In addition, one end of the capacitor C is connected to the anode of the step recovery diode SRD, and the other end of the capacitor C is connected to an input part of the modulation circuit 6. It should be noted that in FIG. 2, an input resistance that is equivalent to the modulation circuit 6 is shown as an equivalent input resistance R. Accordingly, together with the equivalent input resistance R, the capacitor C constructs a differentiating circuit.

Figure 3:
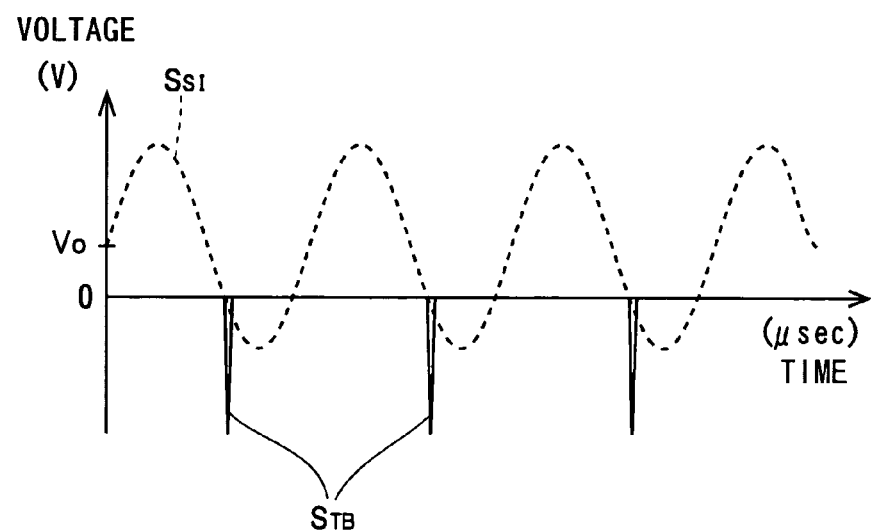
FIG. 3 is a waveform diagram of a sine wave signal (a signal shown by a broken line) supplied to the pulse signal generating circuit and a baseband signal (a signal shown by a solid line) outputted from the pulse signal generating circuit.

In the pulse signal generating circuit 3, in a state where the sine wave signal $S_{SI}$ on which the direct current voltage $V_o$ has been superposed (shown by a broken line in FIG. 3), when the sine wave signal $S_{SI}$ is a positive voltage, energy is accumulated in the coil L when a current flows through the step recovery diode SRD. Next, when the sine wave signal $S_{SI}$ has switched from a positive voltage to a negative voltage, after a period of several picoseconds to several nanoseconds or so has passed from the moment of switching, the step recovery diode SRD suddenly changes from an ON state to an OFF state. When the step recovery diode SRD changes to the OFF state, the energy accumulated in the coil L is instantaneously discharged, thereby generating the baseband signal $S_{TB}$. In this case, the rising and falling times of the baseband signal $S_{TB}$ are set by the time constant of the differentiating circuit constructed by the equivalent input resistance R and the capacitor C. Accordingly, by passing a signal that rises suddenly through the differentiating circuit, as shown by the solid line in FIG. 3, it is possible to obtain a baseband signal $S_{TB}$ with negative polarity and a narrow pulse width. In the radar apparatus 1, it is possible to generate a baseband signal $S_{TB}$ with a narrow pulse width of around 0.6 ns, for example. In this case, by offsetting by (i.e., adding) the direct current voltage $V_o$, it is possible to increase the amount of energy accumulated in the coil L, so that compared to a construction where the direct current voltage $V_o$ is not added, it is possible to increase the amplitude of the baseband signal $S_{TB}$. Accordingly, it is possible to efficiently generate the baseband signal $S_{TB}$. By using a combination of the sine wave signal generating circuit 2 and the step recovery diode SRD, a simple, low-cost construction can be used. The pulse signal generating circuit 3 carries out waveform shaping on the sine wave signal $S_{SI}$ using a waveform shaping circuit (not shown), so that in each cycle of the sine wave signal $S_{SI}$, a transmission start signal $S_{ST}$ that is synchronized with the baseband signal $S_{TB}$ is generated and outputted to the detection signal generating circuit 15.

As shown in FIG. 1, the carrier signal generating circuit 4 continuously generates a carrier wave $S_c$ of a predetermined frequency (for example, 24 GHz) and outputs the carrier wave $S_c$ to the distribution circuit 5. The distribution circuit 5 distributes (outputs) the carrier wave $S_c$ to the modulation circuit 6 and the mixer circuit 12. The modulation circuit 6 modulates the carrier wave $S_c$ using the baseband signal $S_{TB}$ that has negative polarity to generate a high frequency signal $S_{TR}$ and transmits the high frequency signal $S_{TR}$ via the transmission antenna 7. It should be noted that it is possible to incorporate a high frequency amplification circuit that amplifies the high frequency signal $S_{TR}$ inside the modulation circuit 6.

On the other hand, out of the high frequency signal $S_{TR}$ transmitted via the transmission antenna 7, the reception antenna 11 receives the high frequency signal $S_{TR}$ reflected by the vehicle 21 that is the measured object and outputs the received signal as a high frequency signal $S_{RR}$ to the mixer circuit 12. As shown in FIG. 1, the mixer circuit 12 mixes and down-converts the inputted high frequency signal $S_{RR}$ and the carrier signal $S_c$ inputted from the distribution circuit 5 to extract, as a baseband signal $S_{RB}$, a signal component corresponding to the baseband signal $S_{TB}$ from the high frequency signal $S_{RR}$ and outputs the baseband signal $S_{RB}$ to the amplification circuit 13.

As shown in FIG. 1, the amplification circuit 13 amplifies the inputted baseband signal $S_{RB}$ and outputs the amplified signal to the comparator circuit 14. The comparator circuit 14 compares the inputted baseband signal $S_{RB}$ with a reference voltage $V_r$ of a reference power supply, carries out waveform shaping on the baseband signal $S_{RB}$, and outputs the baseband signal $S_{RB}$ to the detection signal generating circuit 15. By doing so, it is possible to remove noise components in the baseband signal $S_{RB}$ that fall below the reference voltage $V_r$ from the baseband signal $S_{RB}$. Based on the baseband signal $S_{RB}$ that has been subjected to waveform shaping and the transmission start signal $S_{ST}$, the detection signal generating circuit 15 generates and outputs a detection signal $S_d$ that can be used to measure the distance to the vehicle 21. More specifically, the detection signal generating circuit 15 generates and outputs the detection signal $S_d$ that rises in synchronization with a rise in the transmission start signal $S_{ST}$ and falls in synchronization with a rise in the baseband signal $S_{RB}$.

Next, the overall operation of the radar apparatus 1 will be described.

As shown in FIGS. 1 and 2, in the radar apparatus 1, first the sine wave signal generating circuit 2 outputs the sine wave signal $S_{SI}$, on which the direct current voltage $V_o$ has been superposed, to the pulse signal generating circuit 3. At this time, reception circuits such as the mixer circuit 12 and the amplification circuit 13 are kept in an operation stopped state. Next, as described above, the pulse signal generating circuit 3 generates the baseband signal $S_{TB}$ with a narrow pulse width (as one example, around 0.6 ns) from the inputted sine wave signal $S_{SI}$, outputs the baseband signal $S_{TB}$ to the modulation circuit 6, and also outputs the transmission start signal $S_{ST}$ produced by carrying out waveform shaping on the baseband signal $S_{TB}$ ("the modulation signal generated by the modulation signal generating circuit" for the present invention) to the detection signal generating circuit 15. At this time, the detection signal generating circuit 15 raises the detection signal $S_d$. On the other hand, the modulation circuit 6 modulates the carrier wave $S_c$ inputted from the distribution circuit 5 using the baseband signal $S_{TB}$ inputted from the pulse signal generating circuit 3 to generate the high frequency signal $S_{TR}$ and outputs the high frequency signal $S_{TR}$ to the transmission antenna 7. By doing so, the high frequency signal $S_{TR}$ with a pulse width of around 0.6 ns, for example, is transmitted from the transmission antenna 7.

Next, when the transmission of the high frequency signal $S_{TR}$ is completed, the reception circuits such as the mixer circuit 12 and the amplification circuit 13 start to operate. At this time, after a predetermined time T1 has elapsed from the start of transmission of the high frequency signal $S_{TR}$ by the transmission antenna 7, the high frequency signal $S_{TR}$ reflected by the vehicle 21 is inputted into the reception antenna 11. In this case, the predetermined time T1 is the time taken for the high frequency signal $S_{TR}$ to go back and forth on the distance D between the radar apparatus 1 and the vehicle 21, that is, the time taken to cover a distance (2×D) that is double the distance D. Next, the mixer circuit 12 mixes the high frequency signal $S_{RR}$ inputted from the reception antenna 11 and the carrier wave $S_c$ to extract the baseband signal $S_{RB}$. After this, the baseband signal $S_{RB}$ outputted from the mixer circuit 12 is amplified by the amplification circuit 13, subjected to waveform shaping by the comparator circuit 14, and then inputted into the detection signal generating circuit 15. In this case, the baseband signal $S_{RB}$ corresponds to "the modulation signal extracted by the modulation signal extracting circuit" for the present invention. Next, the detection signal generating circuit 15 generates and outputs the detection signal $S_d$ that falls in synchronization with the rising of the baseband signal $S_{RB}$ and has a pulse width of time T1. That is, the detection signal generating circuit 15 generates the detection signal $S_d$ based on the transmission start signal $S_{ST}$ that has already been inputted and the baseband signal $S_{RB}$. After this, an external device uses the detection signal $S_d$ outputted from the radar apparatus 1 and calculates the distance D between the radar apparatus 1 and the vehicle 21 based on half the time of the pulse width (the predetermined time T1) of the detection signal $S_d$ and the speed of light.

Here, when the baseband signal $S_{TB}$ (that is, the baseband signal $S_{RB}$) has a pulse width of 0.6 ns, the minimum detection distance for the radar apparatus 1 can be found as shown below. That is, since the speed of the high frequency signal $S_{TR}$ is 300,000 km/s, the signal covers 18 cm in a period of 0.6 ns. When double the distance D between the radar apparatus 1 and the vehicle 21 is shorter than 18 cm, the high frequency signal $S_{TR}$ reflected by the vehicle 21 will be inputted by the reception antenna 11 before the transmission of the high frequency signal $S_{TR}$ has been completed. This means that it is not possible for the radar apparatus 1 to detect a rising edge of the baseband signal $S_{RB}$ and so the distance cannot be detected. Accordingly, the minimum detection distance, i.e., the shortest distance to the vehicle 21 that can be detected by the radar apparatus 1, is a mere 9 cm.

In this way, according to the radar apparatus 1, a modulation signal generating circuit is constructed by the sine wave signal generating circuit 2 and the pulse signal generating circuit 3, and a step recovery diode SRD is used as the pulse signal generating circuit 3, so that a baseband signal STB (modulation signal) with a narrow pulse width can be generated. Accordingly, it is possible to sufficiently shorten the minimum detection distance of the radar apparatus 1. Also, by using the sine wave signal generating circuit 2 and the step recovery diode SRD, a small, low-cost modulation signal generating circuit can be constructed. Accordingly, the radar apparatus 1 can have a small, low-cost construction.

It should be noted that the present invention is not limited to the construction described above. As one example, although the detection signal generating circuit 15 is described as generating the detection signal $S_d$ based on the transmission start signal $S_{ST}$ and the baseband signal $S_{RB}$ in the radar apparatus 1, like a radar apparatus 1A shown in FIG. 4, it is also possible to use a construction where the detection signal $S_d$ is generated based on a high frequency signal $S_{RR0}$ which is a part of the high frequency signal STR outputted via the transmission antenna 7 that has leaked into the reception antenna 11. It should be noted that component elements that have the same functions as the component elements of the radar apparatus 1 have been assigned the same reference numerals and duplicated description thereof has been omitted. In the radar apparatus 1A, the transmission antenna 7 and the reception antenna 11 are disposed close to one another so that part of the high frequency signal $S_{TR}$ transmitted via the transmission antenna 7 can leak into (propagate directly to) the reception antenna 11. In this case, the reception antenna 11 first receives a leaked wave (the high frequency signal $S_{RR0}$) from the transmission antenna 7 disposed nearby and after this receives the high frequency signal $S_{RR}$ reflected by the vehicle 21, and successively outputs the signals to the mixer circuit 12. The reception circuits such as the mixer circuit 12 and the amplification circuit 13 are kept in an operating state while the high frequency signal $S_{TR}$ is transmitted.

Figure 4:
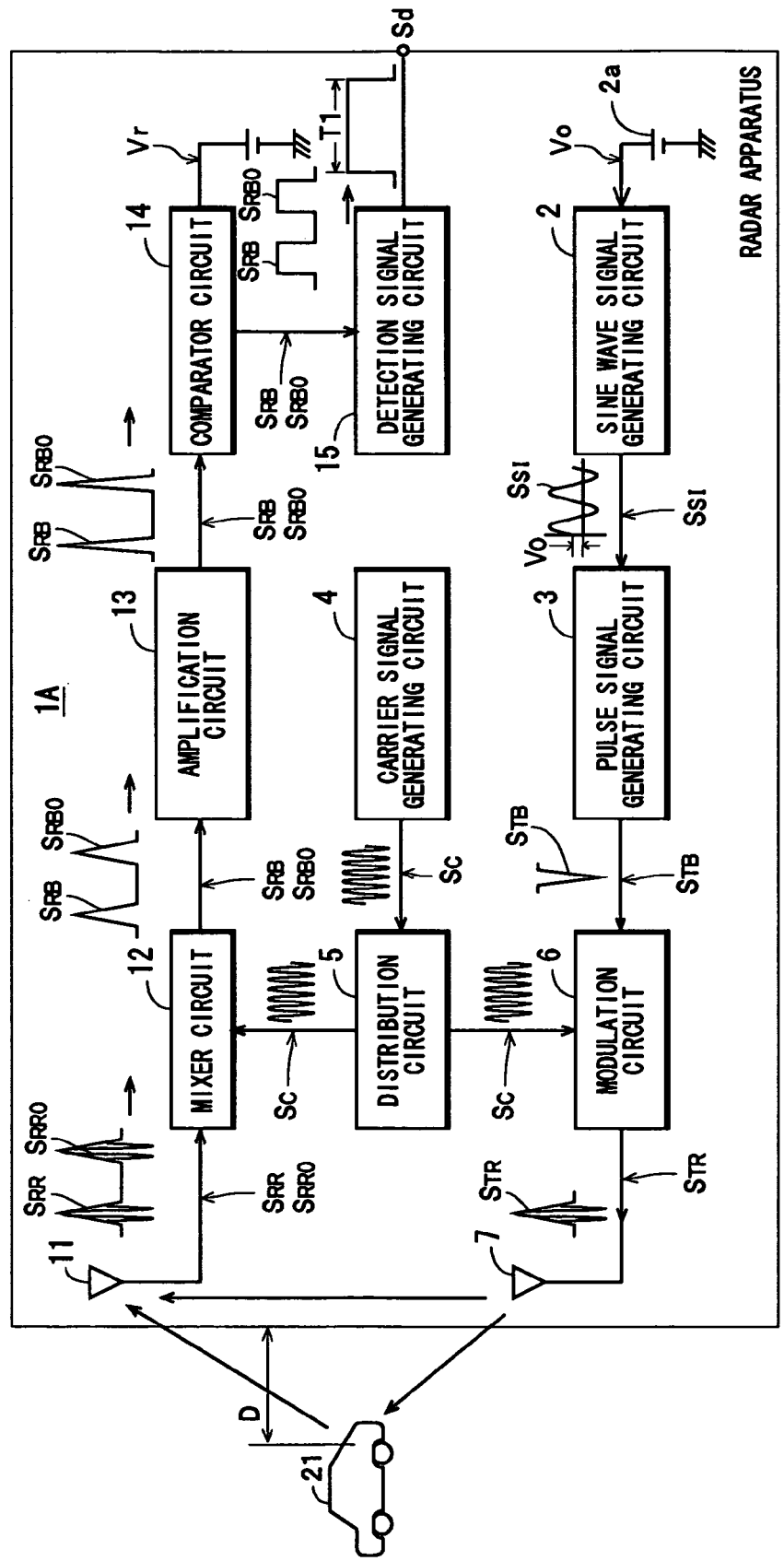
FIG. 4 is a block diagram showing the construction of another radar apparatus according to the present invention.

In the radar apparatus 1A, as shown in FIG. 4, the mixer circuit 12 mixes the inputted high frequency signal $S_{RR0}$ and the carrier wave $S_c$ inputted from the distribution circuit 5 to carry out a down conversion that extracts a baseband signal $S_{RB0}$ from the high frequency signal $S_{RR0}$. The mixer circuit 12 outputs the baseband signal $S_{RB0}$ to the amplification circuit 13. The mixer circuit 12 also mixes the inputted high frequency signal $S_{RR}$ and the carrier wave $S_c$ inputted from the distribution circuit 5 to carry out a down conversion that extracts a baseband signal $S_{RB}$ from the high frequency signal $S_{RR}$. The mixer circuit 12 outputs the baseband signal $S_{RB}$ to the amplification circuit 13. As shown in FIG. 4, the amplification circuit 13 amplifies the inputted baseband signals $S_{RB0}$, $S_{RB}$ and successively outputs the amplified signals to the comparator circuit 14. Next, the comparator circuit 14 compares the inputted baseband signals $S_{RB0}$, $S_{RB}$ with a reference voltage $V_r$, carries out waveform shaping on the baseband signals $S_{RB0}$, $S_{RB}$, and successively outputs the signals to the detection signal generating circuit 15. Here, the baseband signal $S_{RB0}$ corresponds to "one part of the modulation signal that has been extracted by the modulation signal extracting circuit from the high frequency signal that has leaked into the reception antenna from the transmission antenna" for the present invention while the baseband signal $S_{RB}$ corresponds to "the same one part of the modulation signal that has been extracted by the modulation signal extracting circuit from the component of the high frequency signal received by the reception antenna" for the present invention. The detection signal generating circuit 15 raises a detection signal $S_d$ in synchronization with a rise in the baseband signal $S_{RB0}$ that has been subjected to waveform shaping and lowers the detection signal $S_d$ in synchronization with a rise in the baseband signal $S_{RB}$. As a result, the detection signal $S_d$ that can be used to measure the distance to the vehicle 21 is generated based on the baseband signals $S_{RB0}$, $S_{RB}$.

The radar apparatus 1A can achieve the same operational effect as the radar apparatus 1. Since the detection signal $S_d$ can be generated by detecting a time difference between the two received high frequency signals $S_{RR0}$, $S_{RR}$, compared to the radar apparatus 1, there is no error due to delays of the respective circuits, such as the modulation circuit 6, inside the radar apparatus 1, so that it is possible to detect the distance with higher accuracy. It should be noted that although a construction where the high frequency signal is directly outputted to the reception antenna 11 is used, in the radar apparatus 1A, in place of a construction that directly outputs to the reception antenna 11, it is possible to use a construction where the high frequency signal $S_{TR}$ is directly outputted to the mixer circuit 12. In addition, it is also possible to use a construction where the high frequency signal $S_{TR}$ from the modulation circuit 6 is directly outputted to the reception antenna 11 or the mixer circuit 12 via an impedance element such as a resistive element or a capacitive element.

The radar apparatuses 1, 1A have been described by way of examples that use the mixer circuit 12 as one example of a modulation signal extracting circuit, but it is also possible to use a detection circuit or a low pass filter circuit in place of the mixer circuit 12. Also, although examples where the entire radar apparatuses 1, 1A are integrated into single modules have been described, out of the component elements described above, all of the component elements aside from the transmission antenna 7 and the reception antenna 11 may be constructed as single modules. With such a construction, the transmission antenna 7 and the reception antenna 11 can be positioned with increased freedom. It should be noted that although it is preferable for the radar apparatuses 1, 1A to be converted into single modules to make the entire apparatuses compact, when such conversion is not required, it is possible to construct the radar apparatuses 1, 1A from separate circuits that are mounted on a circuit board. It is also possible to use a transmission antenna and a reception antenna that have already been set up. Furthermore, it is possible to use a single shared antenna as the transmission antenna 7 and the reception antenna 11.

The amplification circuit 13 and the comparator circuit 14 are not essential and can be incorporated into the radar apparatus as necessary depending on the level, the S/N ratio, or the like of the baseband signal $S_{RB}$. It should also be obvious that circuits such as amplification circuits and filters may be disposed as appropriate between the respective circuits and between the circuits and the antennas.

What is claimed is:

1. A radar apparatus, comprising:
a modulation signal generating circuit that generates a modulation signal;
a carrier wave generating circuit that generates a carrier wave;
a modulation circuit that outputs a high frequency signal generated by modulating the carrier wave using the modulation signal that has been inputted;
a modulation signal extracting circuit that extracts the modulation signal from the high frequency signal that has been inputted; and a detection signal generating circuit that generates a detection signal, which can be used to measure a distance to a measured object, based on the modulation signal extracted by the modulation signal extracting circuit from a component of the high frequency signal that has been transmitted via a transmission antenna, the component having been reflected by the measured object and received by a reception antenna, wherein the modulation signal generating circuit comprises a sine wave signal generating circuit that generates a sine wave signal and a pulse signal generating circuit that generates a modulation signal by converting the generated sine wave signal to a pulse signal using a step recovery diode.

2. A radar apparatus according to claim 1, wherein the detection signal generating circuit generates the detection signal based on a transmission start signal, which is synchronized with one part of the modulation signal, and the same one part of the modulation signal that has been extracted by the modulation signal extracting circuit from the component of the high frequency signal that has been transmitted via the transmission antenna, the component having been reflected by the measured object and received by the reception antenna.

3. A radar apparatus according to claim 1, wherein the detection signal generating circuit generates the detection signal based on one part of the modulation signal that has been extracted by the modulation signal extracting circuit from the high frequency signal that has leaked into the reception antenna from the transmission antenna, and the same one part of the modulation signal that has been extracted by the modulation signal extracting circuit from the component of the high frequency signal that has been transmitted via the transmission antenna, the component having been reflected by the measured object and received by the reception antenna.

4. A radar apparatus according to claim 1, wherein the sine wave signal generating circuit adds a direct current component to the sine wave signal.

5. A radar apparatus according to claim 2, wherein the sine wave signal generating circuit adds a direct current component to the sine wave signal.

6. A radar apparatus according to claim 3, wherein the sine wave signal generating circuit adds a direct current component to the sine wave signal.

* * * * *